United States Patent
Wang (10) Patent No.: US 12,046,251 B2
(45) Date of Patent: Jul. 23, 2024

(54) INTERPOLATION FILTER SYSTEM IMPLEMENTED BY DIGITAL CIRCUIT

(71) Applicant: AMICRO SEMICONDUCTOR CO., LTD., Guangdong (CN)

(72) Inventor: Lili Wang, Guangdong (CN)

(73) Assignee: AMICRO SEMICONDUCTOR CO., LTD., Guangdong (CN)

(*) Notice: Subject to any disclaimer, the term of this patent is extended or adjusted under 35 U.S.C. 154(b) by 344 days.

(21) Appl. No.: 17/637,818

(22) PCT Filed: Nov. 10, 2019

(86) PCT No.: PCT/CN2019/116930
§ 371 (c)(1),
(2) Date: Feb. 24, 2022

(87) PCT Pub. No.: WO2021/056711
PCT Pub. Date: Apr. 1, 2021

(65) Prior Publication Data
US 2022/0284912 A1    Sep. 8, 2022

(30) Foreign Application Priority Data

Sep. 27, 2019  (CN) .......................... 201910925674.5

(51) Int. Cl.
*G10L 21/02*   (2013.01)
*H03M 1/06*   (2006.01)
*H03M 1/66*   (2006.01)

(52) U.S. Cl.
CPC .......... *G10L 21/02* (2013.01); *H03M 1/0626* (2013.01); *H03M 1/66* (2013.01)

(58) Field of Classification Search
USPC ...................................................... 324/76.28
See application file for complete search history.

(56) References Cited

U.S. PATENT DOCUMENTS 5,592,403 A    1/1997  Trager et al.
2012/0068866 A1*  3/2012  Robinson ............ H03M 1/0836
                                                    341/118

FOREIGN PATENT DOCUMENTS

CN         1992517 A     7/2007
CN       101820287 A     9/2010
(Continued)

OTHER PUBLICATIONS

Peizhi Zeng, "Digital IF Filter Design and Implementation of FPGA", China Academic Journal Electronic Publishing House, Issue 6. Jun. 15, 2015(Jun. 15, 2015). ISSN: 1674-0246. p. 25-41. Figure 3-11 to 3-23.

(Continued)

*Primary Examiner* — Farhana A Hoque
(74) *Attorney, Agent, or Firm* — Samson G. Yu (57) ABSTRACT

An interpolation filtering system implemented by a digital circuit is provided, it includes an interpolation filtering operation controller, a cascaded drive module, an intermediate result cache Random Access Memory (RAM), and a filter coefficient storage Read Only Memory (ROM). The intermediate result cache RAM is configured to store externally input data of the interpolation filtering system and intermediate results output by the filter operation modules. The filter coefficient storage ROM is configured to store filter coefficients required for calculation by the filter operation modules. The interpolation filtering operation controller is configured to control, under the drive of counting beats output by the cascaded drive module, the master state machine to select data of the intermediate result cache TAM or externally directly input data to be sent to the cascaded filter operation modules for accumulation operation, and to select the filter coefficients of the filter coefficient storage ROM for multiplication operation.

9 Claims, 2 Drawing Sheets

An interpolation filter system interpolation filtering system implemented by a digital circuit (56) References Cited

FOREIGN PATENT DOCUMENTS

CN          105048994 A     11/2015
GB           2347569 A      9/2000

OTHER PUBLICATIONS

"Vuerinckxret al: ""Design of a very high resolution network analyser"",IEEE Proceedings of the Instrumentation and Measurementtechnologyconference, vol. -, May 1993(May 1993), pp. 470-475, XP010131438,".
"Crochierereetal: ""Multirate Digital Signal Processing, Multistageimplementationsofsampling Rate Conversion"", 1983, Multirate Digital Signal Processing, pp. 193-196, XP002271059,".
The first office action of family JP application No. 2022-502178 issued on Mar. 14, 2023.
The EESR of family EP application No. 19946877.8 issued on Nov. 2, 2022.

* cited by examiner

INTERPOLATION FILTER SYSTEM IMPLEMENTED BY DIGITAL CIRCUIT

The present disclosure claims priority of Chinese Patent Application No. 201910925674.5, filed to China National Intellectual Property Administration on 27 Sep. 2019 and entitled "Interpolation Filter System Implemented by Digital Circuit", the disclosure of which is incorporated herein by reference in its entirety.

TECHNICAL FIELD

The present disclosure relates to an interpolation filter for a Sigma-delta audio Digital-to-Analog Converter (DAC), and in particular, to an interpolation filtering system implemented by a digital circuit.

BACKGROUND ART

Interpolation filters are widely applied to up-conversion systems, such as a transmitter and an audio DAC, and are configured to improve the sampling frequency of input signals, filter out noises within a passband range, etc. The interpolation filter can be implemented by an analog circuit or a digital circuit. The interpolation filter implemented by the digital circuit can solve the problems of voltage drift and temperature drift, noises, etc. caused by that implemented by the analog circuit, and has high accuracy and stable linear phase. However, most control logic circuits and operation logic circuits of interpolation filters known by the inventor are parallel logic structures, including large register arrays and complex pipeline controllers. In addition, the delay becomes greater and greater with the increase of the number of stages of the digital circuit, so that the overall circuit is complex in design, the operation of the circuit is prone to working faults, and a chip to which the circuit belongs occupies a large area.

SUMMARY

An interpolation filtering system implemented by a digital circuit includes an interpolation filtering operation controller, cascaded drive modules, an intermediate result cache Random Access Memory (RAM), and a filter coefficient storage Read Only Memory (ROM). The interpolation filtering operation controller includes cascaded filter operation modules and a master state machine. Correspondingly, the intermediate result cache RAM includes cascaded RAMs. The intermediate result cache RAM is configured to store externally input data of the interpolation filtering system and intermediate results calculated by a filter operation module of each stage of the interpolation filter calculation controller. The filter coefficient storage ROM is configured to store filter coefficients required for calculation by the filter operation module of each stage of the interpolation filter calculation controller. The cascaded drive modules include a counter configured to control the interpolation filtering operation controller to read and write the intermediate result cache RAM and the filter coefficient storage ROM. The interpolation filtering operation controller is configured to control, under drive of counting beats output by the cascaded drive modules, the master state machine to select data which is cached in the intermediate result cache RAM or data is input externally directly, and send to the cascaded filter operation modules for performing an accumulation operation, and meanwhile, also control the master state machine to select the filter coefficients of the filter coefficient storage ROM and send to the cascaded filter operation modules for performing a multiplication operation, thereby achieving an objective of interpolation filtering after the processing by the cascaded filter operation modules.

In at least one exemplary embodiment of the present disclosure, the interpolation filtering operation controller includes n cascaded filter operation modules and corresponding sub-state machines, the filter operation module of each stage and its corresponding sub-state machine are equivalent to a corresponding half-band filter of each stage. Output results of the half-band filter of each stage are divided into at least one odd subscript output and at least one even subscript output, the output results of the half-band filter of each stage are output successively according to the half-band filter of each stage under the drive of the counting beats output by the cascaded drive modules. The at least one even subscript is started from 0, and the at least one odd subscript is started from 1. The at least one even subscript and the at least one odd subscript are marked from small to large in order of the sequential outputs. The master state machine includes n sub-state machines. The cascaded drive modules drive and match the master state machine to complete following functions. First step, work of a current stage half-band filter is completed, data of the at least one even subscript output that need to be stored is stored in a corresponding address unit of the intermediate result cache RAM, and the data of the at least one odd subscript output that need to be stored is stored in a corresponding register of the current stage half-band filter. Second step, all of output results of the current stage half-band filter are output to a next stage half-band filter directly or indirectly through a corresponding register inside. Then, data of the at least one even subscript output that need to be stored by the next stage half-band filter is stored in an address unit of the intermediate result cache RAM, and the data of the at least one odd subscript output that need to be stored is stored in a corresponding register of the next stage half-band filter. Finally, the first step and the second step are repeated iteratively for serial operation until $2^n$ results obtained from a n-th stage half-band filter of successively are output to an address unit of the intermediate result cache RAM directly or indirectly through a corresponding register inside, and serve as interpolation results of the interpolation filtering operation controller, herein, n is an integer greater than or equal to 1.

In at least one exemplary embodiment of the present disclosure, n is 3. The cascaded filter operation modules include a first-stage Finite Impulse Response (FIR) operation module, a second-stage FIR operation module, and a third-stage FIR operation module. The master state machine includes a first-stage FIR sub-state machine, a second-stage FIR sub-state machine, and a third-stage FIR sub-state machine. The interpolation filtering operation controller includes a first register, a second register, a third register, a fourth register, a fifth register, a sixth register, and a seventh register. The intermediate result cache RAM specifically includes a first-stage FIR Static Random Access Memory (SRAM), a second-stage FIR SRAM, a third-stage FIR SRAM, and a final result SRAM. Output results of the filter operation module of each stage are divided into at least one odd subscript output and at least one even subscript output, the output results of the filter operation module of each stage are output successively according to the half-band filter of each stage under the drive of the counting beats output by the cascaded drive modules. The at least one even subscript is started from 0, and the at least one odd subscript is started from 1. The at least one even subscript and the at least one odd subscript are marked from small to large in order of a sequential output. On a premise that the cascaded drive module matches drive control of the master state machine: externally output data x0 to be interpolated of the interpolation filtering system is continuously input into a data input of the first-stage FIR operation module directly or indirectly through the first-stage FIR SRAM, and under drive control action of the first-stage FIR sub-state machine, the first-stage FIR operation module performs interpolation processing on the externally input data to be interpolated; a first output result y1 of the first-stage FIR operation module is output to the first register, a zeroth output result y0 of the first-stage FIR operation module is output to the second-stage FIR SRAM; an output end of the first register is connected to an input end of the second-stage FIR SRAM, herein the first output result y1 of the first-stage FIR operation module serves as an odd subscript output, and the zeroth output result y0 of the first-stage FIR operation module serves as an even subscript output; under drive control action of the second-stage FIR sub-state machine, the second-stage FIR operation module operates to generate a zeroth output result z0 of the second-stage FIR operation module and a first output result z1 of the second-stage FIR operation module according to the zeroth output result y0 of the first-stage FIR operation module; and the zeroth output result z0 of the second-stage FIR operation module is output to the third-stage FIR SRAM. The first output result z1 of the second-stage FIR operation module is output to the second register. The first output result z1 of the second-stage FIR operation module serves as an odd subscript output. The zeroth output result z0 of the second-stage FIR operation module serves as an even subscript output. Under drive control action of the third-stage FIR sub-state machine, the third-stage FIR operation module operates to generate a zeroth output result p0 of the third-stage FIR operation module and a first output result p1 of the third-stage FIR operation module according to the zeroth output result z0 of the second-stage FIR operation module. The zeroth output result p0 of the third-stage FIR operation module is output to the final result SRAM. The first output result p1 of the third-stage FIR operation module is output to the third register. The third register then outputs the first output result p1 of the third-stage FIR operation module to the final result SRAM, herein the first output result p1 of the third-stage FIR operation module serves as an odd subscript output, and the zeroth output result p0 of the third-stage FIR operation module serves as an even subscript output. The second register outputs the first output result z1 of the second-stage FIR operation module to the third-stage FIR operation module. Under the drive control action of the third-stage FIR sub-state machine, the third-stage FIR operation module operates to generate a second output result p2 of the third-stage FIR operation module and a third output result p3 of the third-stage FIR operation module according to the first output result z1 of the second-stage FIR operation module. The second output result p2 of the third-stage FIR operation module is output to the final result SRAM. The third output result p3 of the third-stage FIR operation module is output to the fourth register. The fourth register then outputs the third output result p3 of the third-stage FIR operation module to the final result SRAM. The third output result p3 of the third-stage FIR operation module serves as an odd subscript output. The second output result p2 of the third-stage FIR operation module serves as an even subscript output. The first register outputs the first output result y1 of the first-stage FIR operation module to the second-stage FIR operation module. Under the drive control action of the second-stage FIR sub-state machine, the second-stage FIR operation module operates to generate a second output result z2 of the second-stage FIR operation module and a third output result z3 of the second-stage FIR operation module according to the first output result y1 of the first-stage FIR operation module. The second output result z2 of the second-stage FIR operation module is output to the third-stage FIR SRAM. The third output result z3 of the second-stage FIR operation module is output to the fifth register. The third output result z3 of the second-stage FIR operation module serves as an odd subscript output. The second output result z2 of the second-stage FIR operation module serves as an even subscript output. Under the drive control action of the third-stage FIR sub-state machine, the third-stage FIR operation module operates to generate a fourth output result p4 of the third-stage FIR operation module and a fifth output result p5 of the third-stage FIR operation module according to the second output result z2 of the second-stage FIR operation module. The fourth output result p4 of the third-stage FIR operation module is output to the final result SRAM. The fifth output result p5 of the third-stage FIR operation module is output to the sixth register. The sixth register then outputs the fifth output result p5 of the third-stage FIR operation module to the final result SRAM. The fifth output result p5 of the third-stage FIR operation module serves as an odd subscript output. The fourth output result p4 of the third-stage FIR operation module serves as an even subscript output. The fifth register outputs the third output result z3 of the second-stage FIR operation module to the third-stage FIR operation module. Under the drive control action of the third-stage FIR sub-state machine, the third-stage FIR operation module operates to generate a sixth output result p6 of the third-stage FIR operation module and a seventh output result p7 of the third-stage FIR operation module according to the third output result z3 of the second-stage FIR operation module. The sixth output result p6 of the third-stage FIR operation module is output to the final result SRAM. The seventh output result p7 of the third-stage FIR operation module is output to the seventh register. The seventh register then outputs the seventh output result p7 of the third-stage FIR operation module to the final result SRAM. The seventh output result p7 of the third-stage FIR operation module serves as an odd subscript output. The sixth output result p6 of the third-stage FIR operation module serves as an even subscript output.

In at least one exemplary embodiment of the present disclosure, when there is more than one externally input data to be interpolated of the interpolation filtering system, the master state machine executes all state transition processes again from an initial state, so that new $2^n$ results obtained from the n-th stage half-band filter successively are output to the address unit of the intermediate result cache RAM directly or indirectly through the corresponding register inside, and serve as new interpolation results output by the interpolation filtering operation controller.

In at least one exemplary embodiment of the present disclosure, the cascaded drive modules include a write logic control sub-module and a read logic control sub-module. The write logic control sub-module and the read logic control sub-module share a counter serving as a drive clock source of the interpolation filtering system. The write logic control sub-module is configured to control a write operation address of the intermediate result cache RAM and a write operation address of the filter system storage ROM according to the counting beats. The read logic control sub-module is configured to control a read operation address of the intermediate result cache read RAM and a read operation address of the filter system storage ROM. The write logic control sub-module and the read logic control sub-module drive a corresponding master state machine to control the cascaded filter operation modules inside the interpolation filtering operation controller to execute an interpolation operation according to a time sequence.

In at least one exemplary embodiment of the present disclosure, the n cascaded filter operation modules, a FIR operation module of each stage includes a read end confirmation sub-module, a write end confirmation sub-module, and a multiplication and accumulation sub-module. The write end confirmation sub-module is configured to write data that is output by a last stage FIR operation module and needs to be operated in a current stage FIR operation module into a corresponding address space of the intermediate result cache RAM according to a counting control signal output by the write logic control sub-module. The read end confirmation sub-module is configured to make the multiplication and accumulation sub-module to read data that is in the corresponding address space of the intermediate result cache RAM and needs to be operated in the current stage FIR operation module according to a counting control signal output by the read logic control sub-module. The multiplication and accumulation sub-module, a serial shift addition structure is composed of a multiplier and an adder, selects data that is in the corresponding address space of the intermediate result cache RAM and needs to be operated in the current stage FIR operation module, sends data into the adder to perform an accumulation operation under joint control of the write end confirmation sub-module and the read end confirmation sub-module, and meanwhile, also selects the filter coefficients of the filter coefficient storage ROM as the multiplier, and sends a multiplier factor into the multiplier to perform a multiplying operation. Data that is sent into the adder or an intermediate accumulation value obtained from an adding operation serves as a multiplicand sent into the multiplier.

In at least one exemplary embodiment of the present disclosure, in the cascaded half-band filters, order set for the half-band filter of each stage are different. At least one zero value is in the filter coefficients of the filter coefficient storage ROM, and the number of the zero value is equal to (order of the half-band filter of each stage−1)/2−1. Setting of an address space with zero value in the filter coefficients of the ROM and a time sequence of zero value in the filter coefficients read by the n cascaded filter operation modules determine that odd subscript outputs of the filter operation module of each stage are equivalent to delay processing results of an input signal of a corresponding stage of the filter operation module.

In at least one exemplary embodiment of the present disclosure, the filter coefficients are processed to 16-bit binary numbers by decimal fixed-point processing.

DETAILED DESCRIPTION OF THE EMBODIMENTS

Technical solutions in the embodiments of the present disclosure will be clearly and completely described herein below with reference to the accompanying drawings in the embodiments of the present disclosure. Apparently, the embodiments described below are merely part rather than all of the embodiments of the present disclosure. Typically, the components of the embodiments of the present, which are described and shown in the accompanying drawings herein, may be arranged and designed in a variety of different configurations. Therefore, the following detailed description of the embodiments of the present disclosure provided in the accompanying drawings is not intended to limit the scope of protection of the present disclosure, but only represents the selected embodiments of the present disclosure. Based on the embodiments of the present disclosure, all other embodiments obtained by those of skill in the art without creative work fall within the protection scope of the present disclosure.

Figure 1:
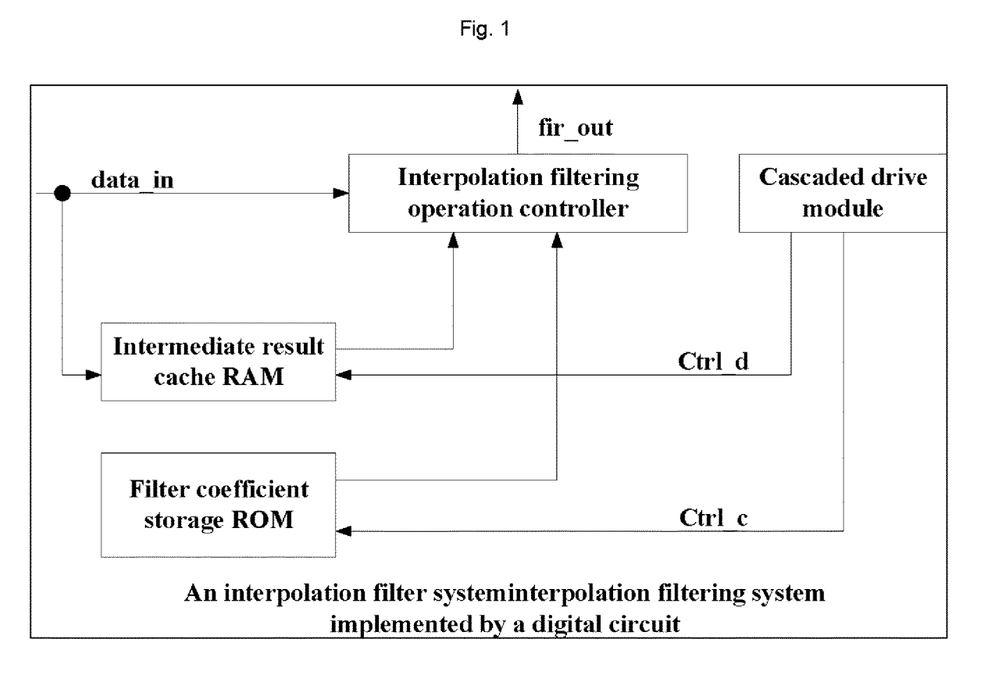
FIG. 1 is an implementation framework schematic diagram of an interpolation filtering system implemented by the digital circuit provided by the embodiments of the present disclosure.

As shown in FIG. 1, the embodiments of the present disclosure provide an interpolation filtering system implemented by a digital circuit. The interpolation filtering system includes an interpolation filtering operation controller, cascaded drive modules, an intermediate result cache Random Access Memory (RAM), and a filter coefficient storage Read Only Memory (ROM). The interpolation filtering operation controller includes cascaded filter operation modules and a master state machine. Correspondingly, the intermediate result cache RAM includes cascaded RAMs. The master state machine here is a logic circuit with circuit working state jump in the technical field of digital circuits, which is implemented on the basis of hardware language. However, the hardware language is also a common implementation method for the digital circuit. Meanwhile, the previously described modules are all designed by corresponding digital logic circuits. The intermediate result cache RAM may preferably be an on-chip Static Random Access Memory (SRAM), and configured to store externally and continuously input data of the interpolation filtering system and an intermediate accumulation result calculated by a filter operation module of each stage of the interpolation filtering operation controller. Data_in, the externally input data of the interpolation filtering system, in the present embodiment, is audio input data in a Polarized continuum model (PCM) format or other data to be processed to interpolation processing, data_in may be directly input into the interpolation filtering operation controller, or may also be input into the interpolation filtering operation controller to participate in an interpolation operation by connecting the intermediate result cache RAM. The filter coefficient storage ROM is configured to store the filter coefficients required by the calculation of the filter operation module of each stage of the interpolation filtering operation controller. The cascaded drive modules include a counter configured to control the interpolation filtering operation controller to read and write the intermediate result cache RAM and the filter coefficient storage ROM. The counter is equivalent to an address counter or an address decoder, and is configurable, so that the counter sends a control triggering signal ctrl d to the intermediate result cache RAM under an appropriate time sequence condition, and sends a control triggering signal ctrl_c to the filter coefficient storage ROM. The interpolation filtering operation controller is configured to control, under drive of counting beats output by the cascaded drive modules, i.e., under the joint control of the control triggering signal ctrl d and the control triggering signal ctrl_c, the master state machine to select data which is cached in the intermediate result cache RAM or data is input externally directly and send to the cascaded filter operation modules for performing an accumulation operation, and meanwhile, also control the master state machine to select the filter coefficients of the filter coefficient storage ROM and send to the cascaded filter operation modules for performing a multiplication operation, thereby achieving an objective of interpolation filtering after the processing by the cascaded filter operation modules. The cascaded filter operation modules output a sum value, i.e., an output end fir_out of the interpolation filtering operation controller in FIG. 1. Filter operation of the present embodiment may be summarized as: sum=product 1+product 2+product 3+ . . . , product= multiplier factor*multiplicand factor. The multiplier factor here is the filter coefficient of the filter coefficient storage RAM. The multiplicand factor is data selected from the intermediate result cache RAM according to a time sequence requirement (or externally directly input cache data or an accumulation intermediate result). The interpolation filtering operation controller controls the externally input audio data and a result signal of one multiplication and accumulation operation to perform a multiplication and accumulation operation. Compared with the related art, the interpolation filtering system provides an interpolation operation system under a cascaded structure, which realizes a multiplication and accumulation operation and a jump between different stages of operation modules on the basis of a state machine logic, and is easy to control. The performance can be improved in a certain range, and the flexibility is high.

It should be noted that a Finite Impulse Response (FIR) filter has many characteristics, for example, strict linear phase, and amplitude characteristics having odd symmetry, even symmetry, etc. The design stability of a FIR digital circuit can be ensured by using the linear phase characteristic of FIR. Otherwise, if the system is unstable, the delay generated by the system becomes greater and greater with the increase of the number of stages of the digital circuit, and finally, the overall system cannot work. Therefore, the embodiments of the present disclosure realize interpolation filtering by using the FIR filter with linear phase and amplitude symmetry characteristic. A half-band filter is one of the FIR filters. The half-band filter is divided into an interpolation half-band filter and an extraction half-band filter. The embodiments of the present disclosure use an interpolation filter which is suitable for an application scenario in an audio player system. The half-band filter has the characteristics that the half-band filter outputs two sampling points when one sampling point is input. A value is interpolated between every two input sampling points of the half-band filter so as to achieve an objective of 2× interpolation. In addition, there are pluralities of interpolation methods, for example, linear interpolation, 0 interpolation, etc. The embodiments of the present disclosure adopt a direct 0 interpolation method.

Specifically, the interpolation filtering operation controller includes n cascaded filter operation modules and corresponding sub-state machines, the filter operation module of each stage and its corresponding sub-state machine are equivalent to a corresponding half-band filter of each stage. The master state machine includes n previously described sub-state machines. Here, the sub-state machines are also digital logic control circuits. The interpolation filtering operation controller is also provided with a register specially for caching an accumulation result of n cascaded filter operation modules. Output results of the half-band filter of each stage are divided into at least one odd subscript output and at least one even subscript output, the output results of the half-band filter of each stage are output successively according to the half-band filter of each stage under the drive of the counting beats output by the cascaded drive modules. The at least one even subscript is started from 0, and the at least one odd subscript is started from 1. The at least one even subscript and the at least one odd subscript are marked from small to large in order of the sequential outputs. For example, at time T1, a first-stage half-band filter operates and outputs a0 and a1. At time T2, a second-stage half-band filter operates and outputs b0 and b1 according to a0 output by the first-stage half-band filter. At time T3, a third-stage half-band filter operates and outputs c0 and c1 according to b0 output by the second-stage half-band filter. At time T4, the second-stage half-band filter operates and outputs b2 and b3 according to a1 output by the first-stage half-band filter. At time T5, the third-stage half-band filter operates and outputs c2 and c3 according to b1 output by the second-stage half-band filter. At time T6, the third-stage half-band filter operates and outputs c4 and c5 according to b2 output by the second-stage half-band filter. At time T7, the third-stage half-band filter operates and outputs c6 and c7 according to b3 output by the second-stage half-band filter. A foregoing sub-state machine can modify triggering conditions and logics through hardware codes, so that the overall system is easy to control.

The cascaded drive modules drive and match the master state machine to complete following functions. First step, work of a current stage half-band filter is completed, data of the at least one even subscript output that need to be stored is stored in a corresponding address unit of the intermediate result cache RAM, and the data of the at least one odd subscript output that need to be stored is stored in a corresponding register of the current stage half-band filter. The current stage half-band filter is multiplexed into $2^a$ sub-filters and registers, a is the number of the current stage minus 1. The current stage half-band filter completes the functions of the $2^a$ half-band filters according to data of the output that needs to be stored. Actually, there is only one circuit of the half band filter completes the operation function of $2^a$ half-band filters by a corresponding sub-state machine matches the master state machine to control the current stage half-band filter. Second step, all of output results of the current stage half-band filter are output to a next stage half-band filter directly or indirectly through a corresponding register inside. Then, data of the at least one even subscript output that need to be stored by the next stage half-band filter is stored in an address unit of the intermediate result cache RAM, and the data of the at least one odd subscript output that need to be stored is stored in a corresponding register of the next stage half-band filter. The next stage half-band filter is multiplexed into $2^b$ half-band filters and registers, b is the number of the next stage minus 1. The next stage half-band filter completes the functions of $2^b$ half-band filters according to data of the output that needs to be stored. Actually, there is only one circuit of the half band filter completes the operation function of $2^b$ half-band filters by a corresponding sub-state machine matches the master state machine to control the next stage half-band filter. The first step and the second step are repeated iteratively for serial operation until the $2^n$ results obtained from a n-th stage half-band filter successively are output to an address unit of the intermediate result cache RAM directly or indirectly through a corresponding register inside, and serve as interpolation results of the interpolation filtering operation controller, and n is an integer greater than or equal to 1. Compared with the related art, the embodiment implements a structure of cascaded half-band filters on the basis of a state machine, which gradually improves sampling rate of signals. Meanwhile, the half-band filter of each stage is multiplexed into a sub-filter that matches the current number of interpolation outputs by dividing the half-band filter of each stage into an odd subscript output branch circuit and an even subscript output branch circuit, which reduces unnecessary storage units and control logics by multiplexing the hardware resources as soon as possible.

In the foregoing embodiments, for equivalent cascaded half-band filters, if order of one stage of the half-band filter is 11, i.e., a Half-Band Filter (HBF) order of the current stage is 11-taps. A matched filter coefficient read by the filter coefficient storage ROM is represented by coeff, data to be interpolated or intermediate result data input by the half-band filter is represented by xi, output of the half-band filter is represented by yi, there is at least one zero value in the filter coefficients of the filter coefficient storage ROM, and the number of the zero value is equal to $(11-1)/2-1=4$.

The following example shows a time domain expression form and an interpolation value process of a half-band filter HBF with 11 taps:

Filter coefficient coeff=[c0, 0, c1, 0, c2, 1, c2, 0, c1, 0, c0];
xi of time 1 nT includes: x0, 0, x1, 0, x2, 0, x3, 0, x4, 0, x5;
xi of time 1.5 nT includes: 0, x0, 0, x1, 0, x2, 0, x3, 0, x4, 0;
xi of time 2 nT includes: x1, 0, x2, 0, x3, 0, x4, 0, x5, 0, x6;
xi of time 2.5 nT includes: 0, x1, 0, x2, 0, x3, 0, x4, 0, x5, 0;
xi of time 3 nT includes: x2, 0, x3, 0, x4, 0, x5, 0, x6, 0, x7;
xi of time 3.5 nT includes:
0, x2, 0, x3, 0, x4, 0, x5, 0, x6, 0;
xi of time 4 nT includes: x3, 0, x4, 0, x5, 0, x6, 0, x7, 0, x8;
xi of time 4.5 nT includes: 0, x3, 0, x4, 0, x5, 0, x6, 0, x7, 0.

The output of the half-band filter is the multiplication and accumulation of coeff and all Xi input at each time, which is specifically shown as follows:

y0=c0*x0+c1*x1+c2*x2+c2*x3+c1*x4+c0*x5;
y1=x2;
y2=c0*x1+c1*x2+c2*x3+c2*x4+c1*x5+c0*x6;
y3=x3;
y4=c0*x2+c1*x3+c2*x4+c2*x5+c1*x6+c0*x7;
y5=x4;
y6=c0*x3+c1*x2+c2*x3+c2*x4+c1*x5+c0*x6;
y7=x5

Therefore, setting of an address space with zero value in the filter coefficients of an ROM and three cascaded filter operation modules for reading the time sequence of the zero value of the filter coefficients determine that the at least one odd subscript output of the filter operation module of each stage is equivalent to a delay processing result of an input signal of the filter operation module of corresponding stage, i.e., the output of the at least one odd subscript, for example, y1, y3, y5, and y7, is the result output directly after a delay input, and the output of the at least one even subscript, for example, y0, y2, y4, and y6, needs to be processed to a multiplication and accumulation operation. The present embodiment adopts a half-band filter structure to realize interpolation, which can reduce operation amount by ½. In this structure, nearly half of the filter coefficients in the half-band filter are 0 and can not participate in the operation, so the filter coefficient storage ROM only needs to store non-zero coefficients, thereby saving half of the ROM space.

Figure 2:
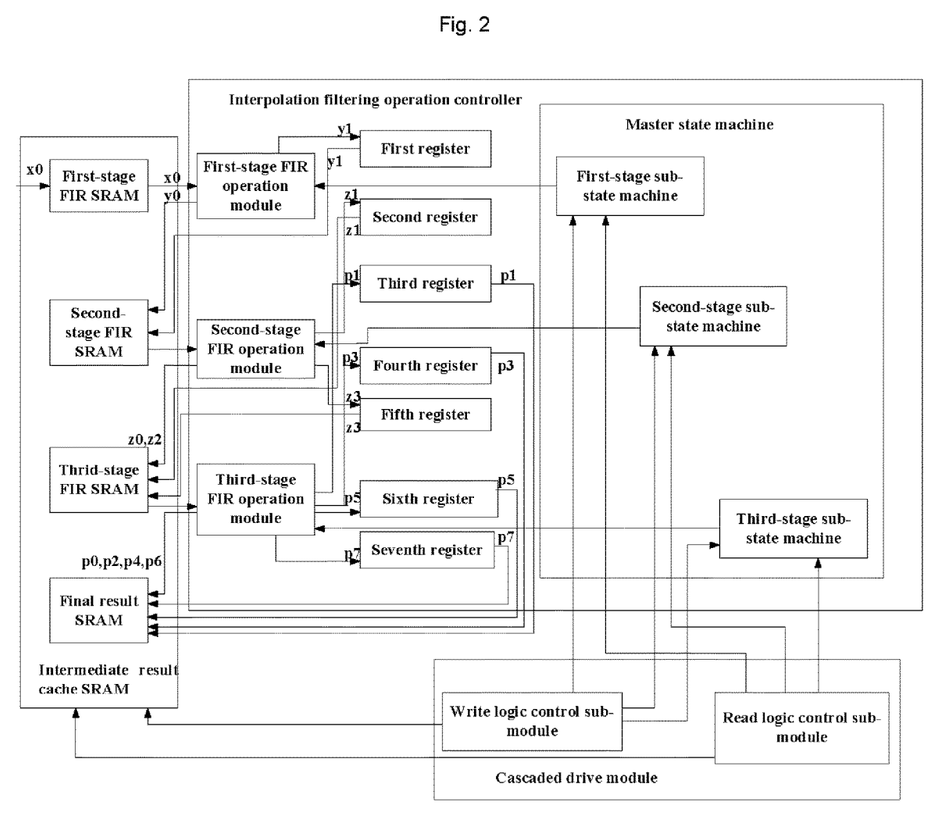
FIG. 2 is an implementation framework schematic diagram of an internal structure and an external connecting structure of an interpolation filtering operation controller provided by the embodiments of the present disclosure.

On the basis of the foregoing embodiments, as shown in FIG. 2, the foregoing n is 3. The cascaded filter operation modules include a first-stage FIR operation module, a second-stage FIR operation module, and a third-stage FIR operation module, which are equivalent to three cascaded half band filters on an interpolation operation function, i.e., the first-stage half-band filter, the second-stage half-band filter, and the third-stage half-band filter. The filter coefficient storage ROM stores three matched filter coefficients, which are respectively used for participating in the multiplication operation of the first-stage FIR operation module, the second-stage FIR operation module, and the third-stage FIR operation module. The intermediate result cache RAM specifically includes a first-stage FIR SRAM, a second-stage FIR SRAM, a third-stage FIR SRAM, and a final result SRAM. The FIR operation module of each stage realizes 2x interpolation after one interpolation data input by the first-stage FIR. SRAM is processed to three-stage 8x interpolation processing of the cascaded filter operation modules, so that the third-stage FIR operation module outputs 8 signals cumulatively, thereby achieving a objective of 8x interpolation. The master state machine includes a first-stage FIR sub-state machine, a second-stage FIR sub-state machine, and a third-stage FIR sub-state machine, they make the interpolation filtering system support state jump. The interpolation filtering operation controller includes a first register, a second register, a third register, a fourth register, a fifth register, a sixth register, and a seventh register, and there are 2^3 minus 1 registers are set in total to serve as an intermediate accumulation result register.

The outputs of the filter operation module of each stage are divided into at least one odd subscript output and at least one even subscript output, which is output successively according to the half-band filter of each stage under drive of the counting beats output by the cascaded drive modules. The at least one even subscript is started from 0, and the at least one odd subscript is started from 1. The at least one even subscript and at least one odd subscript are marked from small to large in order of a sequential output.

Specifically, on a premise that the cascaded drive module matches drive control of the master state machine, referring to FIG. 2, externally input data x0 to be interpolated of the interpolation filtering system is continuously input to a data input of the first-stage FIR operation module indirectly through the first-stage FIR SRAM. Under drive selection action of the first-stage FIR sub-state machine, in combination with matching filter coefficients read from the filter coefficient storage ROM, the first-stage FIR operation module performs interpolation processing on the externally input data to be interpolated, including reading and writing the first-stage FIR SRAM and the second-stage FIR SRAM. A first output result y1 of the first-stage FIR is output to the first register, a zeroth output result y0 of the first-stage FIR is output to the second second-stage FIR SRAM. An output end of the first register is connected to an input end of the second-stage FIR SRAM. The first output result y1 of the first-stage FIR operation module serves as an odd subscript output, the zeroth output result y0 of the first-stage FIR serves as an even subscript output, and the first-stage FIR operation module outputs y0 and y1 simultaneously at the time T0.

Under drive selection action of the second-stage FIR sub-state machine, the second-stage FIR operation module operates and generates a zeroth output result z0 of the second-stage FIR operation module and a first output result z1 of the second-stage FIR operation module according to the zeroth output result y0 of the first-stage FIR operation module in combination with matching filter coefficients read from the filter coefficient storage ROM. At time T1, the zeroth output result z0 of the second-stage FIR operation module is output to the third-stage FIR SRAM, the first output result z1 of the second-stage FIR operation module is output to the second register, and an even subscript output port of the second-stage FIR operation module and an output end of the second register are connected to an input end of the second-stage FIR SRAM. The first output result z1 of the second-stage FIR operation module serves as an odd subscript output, and the zeroth output result z0 of the second-stage FIR operation module serves as an even subscript output. T1>T0, and the time difference value needs to meet a delay length of a read-write operation of the second-stage FIR operation module.

Under drive selection action of the third-stage FIR sub-state machine, the third-stage FIR operation module operates and generates a zeroth output result p0 of the third-stage FIR operation module and a first output result p1 of the third-stage FIR operation module according to the zeroth output result z0 of the second-stage FIR operation module in combination with matching filter coefficients read from the filter coefficient storage ROM. At time T2, the zeroth output result p0 of the third-stage FIR operation module is output to the final result SRAM, the first output result p1 of the third-stage FIR operation module is output to the third register, the third register then outputs the first output result p1 of the third-stage FIR operation module to the final result SRAM. An even subscript output end of the third-stage FIR operation module and an output end of the third register are connected to an input end of the final SRAM. The first output result p1 of the third-stage FIR operation module serves as an odd subscript output, and the zeroth output result p0 of the third-stage FIR operation module serves as an even subscript output. The zeroth output result p0 is output to a port of an external device from an output end fir_out of the interpolation filtering operation controller before the first output result p1. T2>T1, and the time difference value needs to meet a delay length of a read-write operation of the third-stage FIR operation module.

The second register outputs the first output result z1 of the second-stage FIR operation module to the third-stage FIR operation module. Under the drive selection action of the third-stage FIR sub-state machine, the third-stage FIR operation module operates to generate a second output result p2 of the third-stage FIR operation module and a third output result p3 of the third-stage FIR operation module according to the first output result z1 of the second-stage FIR operation module in combination with matching filter coefficients read from the filter coefficient storage ROM. At time T3, the second output result p2 of the third-stage FIR operation module is output to the final result SRAM, and the third output result p3 of the third-stage FIR operation module is output to the fourth register. The fourth register then outputs the third output result p3 of the third-stage FIR operation module to the final result SRAM, so as to multiplex the third-stage FIR operation module and the third-stage FIR SRAM. The third output result p3 of the third-stage FIR operation module serves as an odd subscript output, and the second output result p2 of the third-stage FIR operation module serves as an even subscript output. The second output result p2 is output to a port of an external device from an output end fir_out of the interpolation filtering operation controller before the third output result p3. T3>T2, and the time difference value needs to meet a delay length of a read-write operation of the third-stage FIR operation module.

The first register outputs the first output result y1 of the first-stage FIR operation module to the second-stage FIR operation module. Under the drive selection action of the second-stage FIR sub-state machine, the second-stage FIR operation module operates and generates a second output result z2 of the second-stage FIR operation module and a third output result z3 of the second-stage FIR operation module according to the first output result y1 of the first-stage FIR operation module in combination with matching filter coefficients read from the filter coefficient storage ROM. At time T4, the second output result z2 of the second-stage FIR operation module is output to the third-stage FIR SRAM, the third output result z3 of the second-stage FIR operation module is output to the fifth register, so as to multiplex the second-stage FIR operation module and the second-stage FIR SRAM. The third output result z3 of the second-stage operation module serves as an odd subscript output, and the second output result z2 of the second-stage operation module serves as an even subscript output. T4>T3, and the time difference value needs to meet a delay length of a read-write operation of the second-stage FIR operation module.

Under the drive selection action of the third-stage FIR sub-state machine, the third-stage FIR operation module operates to generate a fourth output result p4 of the third-stage FIR operation module and a fifth output result p5 of the third-stage FIR operation module according to the second output result z2 of the second-stage FIR operation module in combination with matching filter coefficients read from the filter coefficient storage ROM. At time T5, the fourth output result p4 of the third-stage FIR operation module is output to the final result SRAM, the fifth output result p5 of the third-stage FIR operation module is output to the sixth register, and the sixth register then outputs the fifth output result p5 of the third-stage FIR operation module to the final result SRAM, so as to multiplex the third-stage FIR operation module and the third-stage FIR SRAM. The fifth output result p5 of the third-stage FIR operation module serves as an odd subscript output, and the fourth output result p4 of the third-stage FIR operation module serves as an even subscript output. The fourth output result p4 is output to a port of an external device from an output end fr_out of the interpolation filtering operation controller before the fifth output result p5. T5>T4, and the time difference value needs to meet a delay length of a read-write operation of the third-stage FIR operation module.

The fifth register outputs the third output result z3 of the second-stage FIR operation module to the third-stage FIR operation module. Under the drive selection action of the third-stage FIR sub-state machine, the third-stage FIR operation module operates to generate a sixth output result p6 of the third-stage FIR operation module and a seventh output result p7 of the third-stage FIR operation module according to the third output result z3 of the second-stage FIR operation module in combination with matching filter coefficients read from the filter coefficient storage ROM. At time T6, the sixth output result p6 of the third-stage FIR operation module is output to the final result SRAM, and the seventh output result p7 of the third-stage FIR operation module is output to the seventh register. The seventh register then outputs the seventh output result p7 of the third-stage FIR operation module to the final result SRAM, so as to multiplex the third-stage FIR operation module and the SRAM of the third-stage FIR operation module. The seventh output result p7 of the seventh stage FIR operation module serves as an odd subscript output, and the sixth output result p6 of the third-stage FIR operation module serves as an even subscript output. The sixth output result p6 is output to a port of an external device from an output end fir_out of the interpolation filtering operation controller before the seventh output result p7. T6>T5, and the time difference value needs to meet a delay length of a read-write operation of the third-stage FIR operation module.

It is worth noting that the foregoing x0, y0, y1, z0, z1, z2, and z3 contains m pieces of data when serving as input data, and m is equal to the number of matching coefficients read from the filter coefficient storage ROM each time. The branch circuit that outputs an 8× interpolation result p1, p3, p5, and p7 is equivalent to an odd branch circuit (delay output), the branch circuit that outputs an 8× interpolation result p0, p2, p4, and p6 is equivalent to an even branch circuit (operation output), and the phase delay of the odd branch circuit relative to the even branch circuit is determined by the order of the filter.

Compared with the related art, the embodiment adopts three sub-state machines to correspondingly control three stages of the FIR operation modules to perform reading, writing, and multiplication and accumulation operation, and perform a serial 8× interpolation operation on the input data x0 to be interpolated. There is a physical connection relationship among the foregoing operation modules, the registers, and the SRAMs where there is a signal transmission relationship. Under the control of a corresponding state machine, the FIR operation module and the intermediate result cache RAM are multiplexed selectively, which avoid unnecessary register resources and logic control units, saves hardware resources, makes the circuit become configurable, and makes the control more flexible.

When there is more than one externally input data to be interpolated of the interpolation filtering system, the master state machine executes all state transition processes again from an initial state, so that new 2^n results obtained from the half-band filter of n-th stage successively are output to the address unit of the intermediate result cache RAM directly or indirectly through the corresponding register inside, and serve as new interpolation result output by the interpolation filtering operation controller. In the previously described embodiment, the mater state machine not only executes state jump control for x0 input by the first-stage FIR operation module. When the externally input data x1, x2, x3, x4, . . . to be interpolated are continuously input a data input end of the first-stage FIR operation module indirectly through the first-stage FIR SRAM, y2, y3, y4, y5, . . . will be calculated and generated by the first-stage FIR operation module, so that the whole state machine will run again to reflect the real-time effect of the interpolation filtering system processing data. As long as data is sent to the whole system continuously, triggering actions of the sub-state machines included in master state machine in the whole design will continue to run repeatedly, and data is continuously output to an output fir_out of the interpolation filtering system through the processing of the FIR operation module of each stage. The data processing effectiveness of the interpolation filtering system is enhanced, and the real-time performance of the system is improved.

In the foregoing embodiments, the cascaded drive modules, as shown in FIG. 1, preferably include a write logic control sub-module and a read logic control sub-module. The write logic control sub-module and the read logic control sub-module share a counter serving as a drive clock source of the interpolation filtering system. The write logic control sub-module is configured to control a write operation address of the intermediate result cache RAM and a write operation address of the filter system storage ROM according to the counting beats output from the counter. The read logic control sub-module is configured to control a read operation address of the intermediate result cache read RAM and a read operation address of the filter system storage ROM according to the counting beats output from the counter. It can be understood that the write logic control sub-module and the read logic control sub-module are configured to send out a clock control signal. The write logic control sub-module and the read logic control sub-module drive a corresponding master state machine, i.e., trigger the first-stage FIR sub-state machine, the second-stage FIR sub-state machine, and the third-stage FIR sub-state machine under an appropriate counting time, and then control the cascaded filter operation modules inside the interpolation filtering operation controller to execute an interpolation operation according to a time sequence, so as to achieve the objective of 8× interpolation. The present embodiment is beneficial to control jump timing of state machine model, it has only one clock signal, which ensures that the whole design does not have a cross-clock asynchronous processing problem, reduces the complexity of the design, and makes the performance of the whole system more stable.

Figure 3:
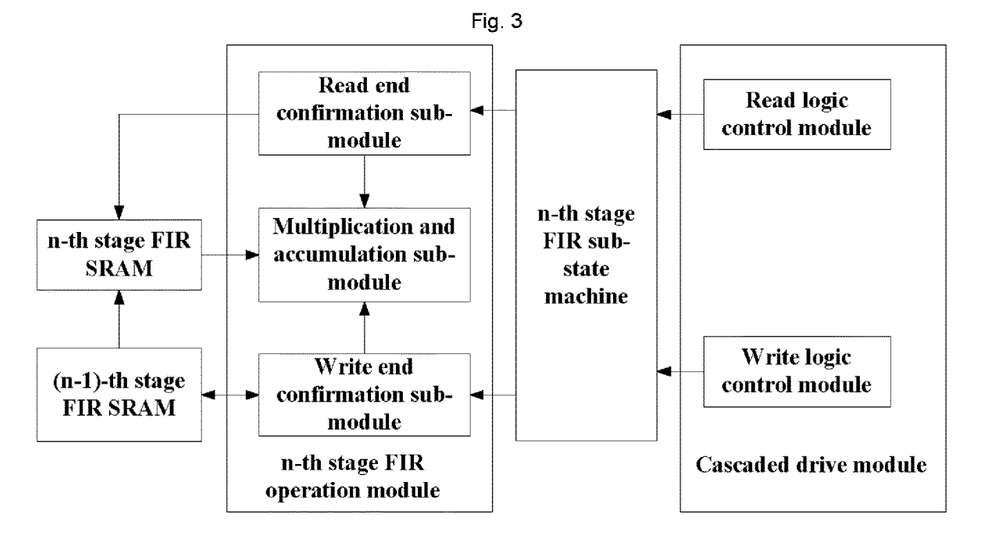
FIG. 3 is an implementation framework schematic diagram of an internal structure and an external connecting structure of an nth stage FIR operation module provided by the embodiments of the present disclosure.

On the basis of the foregoing embodiments, in the n cascaded filter operation modules, a FIR operation of each stage module includes a read end confirmation sub-module, a write end confirmation sub-module, and a multiplication and accumulation sub-module. Referring to FIG. 3, for a n-th stage FIR operation module, the write logic control sub-module triggers to control the write end confirmation sub-module through the n-th stage FIR sub-state machine, the write logic control sub-module is configured to trigger the state jump output by the n-th stage FIR sub-state machine according to a counting control signal output by the write logic control sub-module, so that the write logic control sub-module writes data that is output by a last stage FIR operation module and needs to be operated in a current stage FIR operation module into a corresponding address space of the intermediate result cache RAM under corresponding conditions, i.e., controls to write the result data output from a (n−1)-th FIR SRAM in FIG. 1 into the corresponding address space inside a n-th stage FIR SRAM. Similarly, the read logic control sub-module triggers to control the read end confirmation sub-module through the n-th stage FIR sub-state machine, the read logic control sub-module is configured to trigger the state jump output by the n-th stage FIR sub-state machine according to a counting control signal output by the read logic control sub-module, so that a multiplication and accumulation sub-module reads the data that is in the corresponding address space of the intermediate result cache RAM and needs to be operated in the current stage FIR operation module under the corresponding conditions, i.e., controls the multiplication and accumulation sub-module to read the n-th stage FIR SRAM. The multiplication and accumulation sub-module, a serial shift addition structure is composed of a multiplier and an adder, selects data that is in the corresponding address space of the intermediate result cache RAM and needs to be operated in the current stage FIR operation module, sends data into the adder to perform an accumulation operation under joint control of the write end confirmation sub-module and the read end confirmation sub-module, and meanwhile, also selects the filter coefficients of the filter coefficient storage ROM as the multiplier, and sends a multiplier factor into the multiplier to perform a multiplying operation. Data that is sent into the adder by the n-th stage FIR SRAM may be input the multiplier to serve as a multiplicand directly, and an intermediate accumulation value obtained from an adding operation of the current stage (nth stage) may also be sent into the (n+1)-th stage FIR SRAM, and then be sent into the multiplier to serve as a multiplicand.

Specifically, for the first-stage FIR operation module, data x0 is controlled to be written into the address space corresponding to the first-stage FIR SRAM by drive of the first-stage FIR sub-state machine according to the counting control signal output by the write logic control sub-module. When the counting beat output by the write logic control sub-module reaches a first delay length, the first-stage FIR sub-state machine is triggered to change the current working state of the first-stage FIR operation module, then the first-stage FIR sub-state machine is controlled read one x0 from the corresponding address space to the first-stage FIR SRAM according to the counting control signal output by the read logic control sub-module, and simultaneously, to read matching filter coefficients from the filter coefficient storage ROM to participate in executing a multiplication and accumulation calculation operation. It is worth noting that the multiplier of the first-stage FIR operation module is implemented by a Booth multiplier combined with shift adding and Booth4 coding, which can reduce the area and the delay of the multiplier. When the counting beats output by the read logic control sub-module reaches a second delay length, the first-stage FIR sub-state machine is triggered to change the current working state of the first-stage FIR operation module, which indicates that the first-stage FIR operation module has completed the multiplication and accumulation operation of the input x0 to obtain intermediate result data y0 and y1.

For the second-stage operation module, y0 output by the first-stage FIR operation module is controlled to be written into the corresponding address space to the second-stage FIR. SRAM by drive of the second-stage FIR sub-state machine according to the counting control signal output by the write logic control sub-module. When the counting beat output by the write logic control sub-module reaches a third delay length, the action of the writing y0 is completed, simultaneously, the second-stage FIR sub-state machine is triggered to change the current working state of the second-stage FIR operation module, then the second-stage FIR sub-state machine is controlled read all data from the corresponding address space to the second-stage FIR SRAM according to the counting control signal output by the read logic control sub-module, and simultaneously, to read matching filter coefficients from the filter coefficient storage ROM to participate in multiplication and accumulation calculation. When the counting beat of the read logic control sub-module reaches a fourth delay length, then the second-stage FIR operation module has completed the multiplication and accumulation operation of y0, and intermediate results z0 and z1 are output. Simultaneously, the second-stage FIR sub-state machine is triggered to change the current working state of the second-stage FIR operation module, and then y0 output by the first-stage FIR operation module is started to be written into the corresponding address space to the second-stage FIR SRAM according to the counting control signal output by the write logic control sub-module. When the counting beat output by the write logic control sub-module reaches a fifth delay length, the action of writing y1 is completed, and simultaneously, the second-stage FIR sub-state machine is triggered to change the current working state of the second-stage FIR operation module, then, the second-stage FIR operation module is controlled to read all data from the corresponding address space to the second-stage FIR SRAM according to the counting control signal output from the read logic control sub-module, and simultaneously, to read matching filter coefficients from the filter coefficient storage ROM to participate in multiplication and accumulation calculation. When the counting beat of the read logic control sub-module reaches a sixth delay length, then the second-stage FIR operation module has completed the multiplication and accumulation operation of y1, and intermediate results z2 and z3 are output.

For the third-stage FIR operation module, z0 output by the second-stage FIR operation module is controlled to be written into the corresponding address space to the third-stage FIR SRAM by drive of the third-stage FIR sub-state machine according to the counting control signal output by the write logic control sub-module. When the counting beat output by the write logic control sub-module reaches a seventh delay length, the action of the writing z0 is completed, simultaneously, the third-stage FIR sub-state machine is triggered to change the current working state of the third-stage FIR operation module, then the third-stage FIR sub-state machine is controlled read all data from the corresponding address space to the second-stage FIR SRAM according to the counting control signal output by the read logic control sub-module, and simultaneously, to read matching filter coefficients from the filter coefficient storage ROM to participate in multiplication and accumulation calculation. When the counting beat of the read logic control sub-module reaches an eighth delay length, then the third-stage FIR operation module has completed the multiplication and accumulation operation of z0, and the result data p0 and p1 of 8× interpolation filter are output. Then, the third-stage FIR sub-state machine is triggered to change the current working state of the third-stage FIR operation module, and then z1 output by the second-stage FIR operation module is started to be written into the corresponding address space to the third-stage FIR SRAM according to the counting control signal output by the write logic control sub-module. When the counting beat output by the write logic control sub-module reaches a ninth delay length, the action of writing z1 is completed, and simultaneously, the third-stage FIR sub-state machine is triggered to change the current working state of the third-stage FIR operation module, then, the third-stage FIR operation module is controlled to read all data from the corresponding address space to the third-stage FIR SRAM according to the counting control signal output from the read logic control sub-module, and simultaneously, to read matching filter coefficients from the filter coefficient storage ROM to participate in multiplication and accumulation calculation together. When the counting beat of the read logic control sub-module reaches a tenth delay length, then the third-stage FIR operation module has completed the multiplication and accumulation operation of z1, and the result data p2 and p3 of 8× interpolation filter are output. Then, the third-stage FIR sub-state machine is triggered to change the current working state of the third-stage FIR operation module, and then z2 output by the second-stage FIR operation module is started to be written into the address space corresponding to the SRAM of the third-stage FIR according to the counting control signal output by the write logic control sub-module. When the counting beat output by the write logic control sub-module reaches an eleventh delay length, the action of writing z2 is completed, and simultaneously, the third-stage FIR sub-state machine is triggered to change the current working state of the third-stage FIR operation module, then, the third-stage FIR operation module is controlled to read all data from the corresponding address space to the third-stage FIR SRAM according to the counting control signal output from the read logic control sub-module, and simultaneously, to read matching filter coefficients from the filter coefficient storage ROM to participate in multiplication and accumulation calculation together. When the counting beat of the read logic control sub-module reaches a twelfth delay length, then the third-stage FIR operation module has completed the multiplication and accumulation operation of z2, and the result data p4 and p5 of 8× interpolation filter are output. Then, the third-stage FIR sub-state machine is triggered to change the current working state of the third-stage FIR operation module, and then z3 output by the second-stage FIR operation module is started to be written into the corresponding address space to the third-stage FIR SRAM according to the counting control signal output by the write logic control sub-module. When the counting beat output by the write logic control sub-module reaches a thirteenth delay length, the action of writing z3 is completed, and simultaneously, the third-stage FIR sub-state machine is triggered to change the current working state of the third-stage FIR operation module, then, the third-stage FIR operation module is controlled to read all data from the corresponding address space to the third-stage FIR SRAM according to the counting control signal output from the read logic control sub-module, and simultaneously, to read matched filter coefficients from the filter coefficient storage ROM to participate in multiplication and accumulation calculation together. When the counting beat of the read logic control sub-module reaches a fourteenth delay length, then the third-stage FIR operation module has completed the multiplication and accumulation operation of z, and the result data p6 and p7 of 8× interpolation filter are output. In this operating process controlled by the master state machine, result data of the finally output 8× interpolation filter is p0, p1, p2, p3, p4, p5, p6, and p7 based on the input data x0. Therefore, in view of the complexity of a circuit implementation code, it is easier to implement 8× interpolation operation by counting control of the state machine than parallel, DA distributed, and other structure logics. Codes are easy to implement and maintain, and have efficient sequence controllability.

Preferably, the filter coefficients are processed to 16-bit binary numbers by decimal fixed-point processing. The filter coefficients need to be obtained by performing simulation processing through Matlab mathematical tool in advance. The filter coefficients obtained by simulation are floating-point numbers with a sign bit and a decimal point. Different filter coefficients directly affect passband ripple, stopband attenuation, transition band width, filtering effect, etc. of the whole filter. Because digital circuits are expressed in binary, the filter coefficients in Matlab algorithm need to be processed to fixed-point processing to take different coefficient bit widths, and real number coefficients determined in Matlab algorithm will have different degrees of deviation. However, from the hardware cost (the bit width is greater, the more multiplier resources will be occupied, and it may be too wide to complete within one clock cycle, resulting in the increase of delay), and based on the comprehensive consideration of the filter performance to be realized, the present embodiment determines the 16-bit bit width to perform fixed-point processing on the full precision real number coefficients, and uses the form of binary complement code to express. The real number coefficients are applied to the implementation of the digital circuit of the filter. According to audio scenario application, the working clock required for the interpolation filtering system is generally slow, for example, 256*fs. Under the 40 nm process, one multiplication operation can be completed within one clock cycle. By evaluating the error impact caused by passband ripple and stopband attenuation of the filter comprehensively, the digital circuit of the interpolation filter occupies relatively low hardware resource cost.

The above is merely the preferred embodiments of the present disclosure, and is not intended to limit the present disclosure. For those skilled in the art, the present disclosure may have various modifications and changes. Any modifications, equivalent replacements, improvements and the like made within the spirit and principle of the present disclosure shall fall within the scope of protection of the present disclosure. It should be noted that: similar numerals and letters represent similar items in the following accompanying drawings. Therefore, once a certain item is defined in one accompanying drawing, it is unnecessary to further define and explain the certain item in subsequent accompanying drawings.

What is claimed is:

1. An interpolation filtering system implemented by a digital circuit, comprising an interpolation filtering operation controller, cascaded drive modules, an intermediate result cache Random Access Memory (RAM), and a filter coefficient storage Read Only Memory (ROM), wherein the interpolation filtering operation controller comprises cascaded filter operation modules and a master state machine;

the intermediate result cache RAM is configured to store externally input data of the interpolation filtering system and intermediate results calculated by a filter operation module of each stage of the interpolation filter calculation controller;

the filter coefficient storage ROM is configured to store filter coefficients required for calculation by the filter operation module of each stage of the interpolation filter calculation controller;

the cascaded drive modules comprise a counter configured to control the interpolation filtering operation controller to read and write the intermediate result cache RAM and the filter coefficient storage ROM; and the interpolation filtering operation controller is configured to control, under drive of counting beats output by the cascaded drive modules, the master state machine to select data which is cached in the intermediate result cache RAM or data is input externally directly, and send to the cascaded filter operation modules for performing an accumulation operation, and meanwhile, also control the master state machine to select the filter coefficients of the filter coefficient storage ROM and send to the cascaded filter operation modules for performing a multiplication operation, thereby achieving an objective of interpolation filtering after the processing by the cascaded filter operation modules.

2. The interpolation filtering system according to claim 1, wherein the interpolation filtering operation controller comprises n cascaded filter operation modules and corresponding sub-state machines, the filter operation module of each stage and its corresponding sub-state machine are equivalent to a corresponding half-band filter of each stage; output results of the half-band filter of each stage are divided into at least one odd subscript output and at least one even subscript output, the output results of the half-band filter of each stage are output successively according to the half-band filter of each stage under the drive of the counting beats output by the cascaded drive modules; the at least one even subscript is started from 0, and the at least one odd subscript is started from 1; the at least one even subscript and the at least one odd subscript are marked from small to large in order of the sequential output; the master state machine comprises n sub-state machines;

the cascaded drive modules drive and match the master state machine to complete following functions:

first step, completing work of a current stage half-band filter, storing data of the at least one even subscript output that need to be stored in a corresponding address unit of the intermediate result cache RAM, and storing data of the at least one odd subscript output that need to be stored in a corresponding register of the current stage half-band filter;

second step, outputting all of output results of the current stage half-band filter to a next stage half-band filter directly or indirectly through a corresponding register inside; then, storing data of the at least one even subscript output that need to be stored by the next stage half-band filter in an address unit of the intermediate result cache RAM, and storing data of the at least one odd subscript output that need to be stored in a corresponding register of the next stage half-band filter; and repeating the first step and the second step iteratively for serial operation until $2^n$ results obtained from n-th stage half-band filter successively are output to an address unit of the intermediate result cache RAM directly or indirectly through a corresponding register inside, and serve as interpolation results of the interpolation filtering operation controller, wherein n is an integer greater than or equal to 1.

3. The interpolation filtering system according to claim 2, wherein n is 3; the cascaded filter operation modules comprise a first-stage Finite Impulse Response (FIR) operation module, a second-stage FIR operation module, and a third-stage FIR operation module; the master state machine comprises a first-stage FIR sub-state machine, a second-stage FIR sub-state machine, and a third-stage FIR sub-state machine; the interpolation filtering operation controller comprises a first register, a second register, a third register, a fourth register, a fifth register, a sixth register, and a seventh register; the intermediate result cache RAM specifically comprises a first-stage FIR Static Random Access Memory (SRAM), a second-stage FIR SRAM, a third-stage FIR SRAM, and a final result SRAM;

output results of the filter operation module of each stage are divided into at least one odd subscript output and at least one even subscript output, the output results of the filter operation module of each stage are output successively according to the half-band filter of each stage under the drive of the counting beats output by the cascaded drive modules; the at least one even subscript is started from 0, and the at least one odd subscript is started from 1; the at least one even subscript and the at least one odd subscript are marked from small to large in order of a sequential output;

on a premise that the cascaded drive module matches drive control of the master state machine:

externally output data (x0) to be interpolated of the interpolation filtering system is continuously input into a data input of the first-stage FIR operation module directly or indirectly through the first-stage FIR SRAM, and under drive control action of the first-stage FIR sub-state machine, the first-stage FIR operation module performs interpolation processing on the externally input data to be interpolated in combination with matching filter coefficients read from the filter coefficient storage ROM; a first output result (y1) of the first-stage FIR operation module is output to the first register, a zeroth output result (y0) of the first-stage FIR operation module is output to the second-stage FIR SRAM; the first output result (y1) of the first-stage FIR operation module serves as an odd subscript output, and the zeroth output result (y0) of the first-stage FIR operation module serves as an even subscript output;

under drive control action of the second-stage FIR sub-state machine, the second-stage FIR operation module operates to generate a zeroth output result (z0) of the second-stage FIR operation module and a first output result (z1) of the second-stage FIR operation module according to the zeroth output result (y0) of the first-stage FIR operation module and in combination with matching filter coefficients read from the filter coefficient storage ROM; and the zeroth output result (z0) of the second-stage FIR operation module is output to the third-stage FIR SRAM; the first output result (z1) of the second-stage FIR operation module is output to the second register; the first output result (z1) of the second-stage FIR operation module serves as an odd subscript output; and the zeroth output result (z0) of the second-stage FIR operation module serves as an even subscript output;

under drive control action of the third-stage FIR sub-state machine, the third-stage FIR operation module operates to generate a zeroth output result (p0) of the third-stage FIR operation module and a first output result (p1) of the third-stage FIR operation module according to the zeroth output result (z0) of the second-stage FIR operation module and in combination with matching filter coefficients read from the filter coefficient storage ROM; the zeroth output result (p0) of the third-stage FIR operation module is output to the final result SRAM; the first output result (p1) of the third-stage FIR operation module is output to the third register; the third register then outputs the first output result (p1) of the third-stage FIR operation module to the final result SRAM, wherein the first output result (p1) of the third-stage FIR operation module serves as an odd subscript output, and the zeroth output result (p0) of the third-stage FIR operation module serves as an even subscript output;

the second register outputs the first output result (z1) of the second-stage FIR operation module to the third-stage FIR operation module; under the drive control action of the third-stage FIR sub-state machine, the third-stage FIR operation module operates to generate a second output result (p2) of the third-stage FIR operation module and a third output result (p3) of the third-stage FIR operation module according to the first output result (z1) of the second-stage FIR operation module and in combination with matching filter coefficients read from the filter coefficient storage ROM; the second output result (p2) of the third-stage FIR operation module is output to the final result SRAM; the third output result (p3) of the third-stage FIR operation module is output to the fourth register; the fourth register then outputs the third output result (p3) of the third-stage FIR operation module to the final result SRAM; the third output result (p3) of the third-stage FIR operation module serves as an odd subscript output; the second output result (p2) of the third-stage FIR operation module serves as an even subscript output;

the first register outputs the first output result (y1) of the first-stage FIR operation module to the second-stage FIR operation module; under the drive control action of the second-stage FIR sub-state machine, the second-stage FIR operation module operates to generate a second output result (z2) of the second-stage FIR operation module and a third output result (z3) of the second-stage FIR operation module according to the first output result (y1) of the first-stage FIR operation module and in combination with matching filter coefficients read from the filter coefficient storage ROM; the second output result (z2) of the second-stage FIR operation module is output to the third-stage FIR SRAM; the third output result (z3) of the second-stage FIR operation module is output to the fifth register; the third output result (z3) of the second-stage FIR operation module serves as an odd subscript output; the second output result (z2) of the second-stage FIR operation module serves as an even subscript output;

under the drive control action of the third-stage FIR sub-state machine, the third-stage FIR operation module operates to generate a fourth output result (p4) of the third-stage FIR operation module and a fifth output result (p5) of the third-stage FIR operation module according to the second output result (z2) of the second-stage FIR operation module and in combination with matching filter coefficients read from the filter coefficient storage ROM; the fourth output result (p4) of the third-stage FIR operation module is output to the final result SRAM; the fifth output result (p5) of the third-stage FIR operation module is output to the sixth register; the sixth register then outputs the fifth output result (p5) of the third-stage FIR operation module to the final result SRAM; the fifth output result (p5) of the third-stage FIR operation module serves as an odd subscript output; the fourth output result (p4) of the third-stage FIR operation module serves as an even subscript output; and the fifth register outputs the third output result (z3) of the second-stage FIR operation module to the third-stage FIR operation module; under the drive control action of the third-stage FIR sub-state machine, the third-stage FIR operation module operates to generate a sixth output result (p6) of the third-stage FIR operation module and a seventh output result (p7) of the third-stage FIR operation module according to the third output result (z3) of the second-stage FIR operation module and in combination with matching filter coefficients read from the filter coefficient storage ROM; the sixth output result (p6) of the third-stage FIR operation module is output to the final result SRAM; the seventh output result (p7) of the third-stage FIR operation module is output to the seventh register; the seventh register then outputs the seventh output result (p7) of the third-stage FIR operation module to the final result SRAM; the seventh output result (p7) of the third-stage FIR operation module serves as an odd subscript output; and the sixth output result (p6) of the third-stage FIR operation module serves as an even subscript output.

4. The interpolation filtering system according to claim 3, wherein when there is more than one piece of the externally input data to be interpolated of the interpolation filtering system, the master state machine executes all state transition processes again from an initial state, so that new $2^n$ results obtained from the n-th stage half-band filter successively are output to the address unit of the intermediate result cache RAM directly or indirectly through the corresponding register inside, and serve as new interpolation results output by the interpolation filtering operation controller.

5. The interpolation filtering system according to claim 2, wherein the cascaded drive modules comprise a write logic control sub-module and a read logic control sub-module; the write logic control sub-module and the read logic control sub-module share a counter serving as a drive clock source of the interpolation filtering system; the write logic control sub-module is configured to control a write operation address of the intermediate result cache RAM and a write operation address of the filter system storage ROM according to the counting beats; the read logic control sub-module is configured to control a read operation address of the intermediate result cache read RAM and a read operation address of the filter system storage ROM; and the write logic control sub-module and the read logic control sub-module drive a corresponding master state machine to control the cascaded filter operation modules inside the interpolation filtering operation controller to execute an interpolation operation according to a time sequence.

6. The interpolation filtering system according to claim 5, wherein in the n cascaded filter operation modules, a FIR operation module of each stage comprises a read end confirmation sub-module, a write end confirmation sub-module, and a multiplication and accumulation sub-module;

the write end confirmation sub-module is configured to write data that is output by a last stage FIR operation module and needs to be operated in a current stage FIR operation module into a corresponding address space of the intermediate result cache RAM according to a counting control signal output by the write logic control sub-module;

the read end confirmation sub-module is configured to make the multiplication and accumulation sub-module to read data that is in the corresponding address space of the intermediate result cache RAM and needs to be operated in the current stage FIR operation module according to a counting control signal output by the read logic control sub-module; and the multiplication and accumulation sub-module, a serial shift addition structure is composed of a multiplier and an adder, selects data that is in the corresponding address space of the intermediate result cache RAM and needs to be operated in the current stage FIR operation module, and sends data into the adder to perform an accumulation operation under joint control of the write end confirmation sub-module and the read end confirmation sub-module, meanwhile, also selects the filter coefficients of the filter coefficient storage ROM as the multiplier, and sends a multiplier factor into the multiplier to perform a multiplying operation, wherein data sent into the adder or a intermediate accumulation value obtained from a adding operation serves as a multiplicand to be sent into the multiplier.

7. The interpolation filtering system according to claim 6, wherein in the cascaded half-band filters, orders set for the half-band filter of each stage are different; at least one zero value is in the filter coefficients of the filter coefficient storage ROM, and the number of the zero value is equal to (orders of the half-band filter of each stage $-1)/2-1$; and setting of an address space with zero value in the filter coefficients of the ROM and a time sequence of zero value in the filter coefficients read by the n cascaded filter operation modules determine that odd subscript outputs of the filter operation module of each stage are equivalent to delay processing results of an input signal of a corresponding stage of the filter operation module.

8. The interpolation filtering system according to claim 7, wherein the filter coefficients are processed to 16-bit binary numbers by decimal fixed-point processing.

9. The interpolation filtering system according to claim 2, wherein the cascaded drive modules comprise a write logic control sub-module and a read logic control sub-module; the write logic control sub-module and the read logic control sub-module share a counter serving as a drive clock source of the interpolation filtering system; the write logic control sub-module is configured to control a write operation address of the intermediate result cache RAM and a write operation address of the filter system storage ROM according to the counting beats; the read logic control sub-module is configured to control a read operation address of the intermediate result cache read RAM and a read operation address of the filter system storage ROM; and the write logic control sub-module and the read logic control sub-module drive a corresponding master state machine to control the cascaded filter operation modules inside the interpolation filtering operation controller to execute an interpolation operation according to a time sequence.

* * * * *